(12) United States Patent
Nakao

(10) Patent No.: US 6,449,386 B1
(45) Date of Patent: Sep. 10, 2002

(54) PATTERNED FIGURE RESOLUTION VERIFICATION METHOD AND SEMICONDUCTOR PATTERN FORMING METHOD

(75) Inventor: Shuji Nakao, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/267,159

(22) Filed: Mar. 12, 1999

(30) Foreign Application Priority Data

Oct. 5, 1998 (JP) .......................................... 10-282455

(51) Int. Cl.[7] ................................................. G06K 9/00
(52) U.S. Cl. ..................... 382/144; 382/149; 356/237.5
(58) Field of Search ................................. 382/144, 151, 382/145, 149, 157, 266, 285; 356/384, 390, 394, 237.4, 237.5; 348/87, 126, 129, 130; 438/16; 250/559.04, 559.05

(56) References Cited

U.S. PATENT DOCUMENTS

| | | | | |
|---|---|---|---|---|
| 4,555,798 A | * | 11/1985 | Broadbent, Jr. et al. ........ 382/8 |
| 4,893,346 A | * | 1/1990 | Bishop ........................... 382/8 |
| 5,475,766 A | * | 12/1995 | Tsuchiya et al. ............ 382/144 |
| 5,736,280 A | * | 4/1998 | Tsudaka ....................... 430/30 |
| 5,745,388 A | * | 4/1998 | Mimotogi et al. ........... 364/578 |
| 5,799,104 A | * | 8/1998 | Nakamura et al. .......... 382/144 |
| 6,038,020 A | * | 3/2000 | Tsukuda ................... 356/237.5 |
| 6,078,738 A | * | 6/2000 | Garza et al. ................. 395/500 |
| 6,275,604 B1 | * | 8/2001 | Miyajima et al. ........... 382/146 |

FOREIGN PATENT DOCUMENTS

JP 09-034101 2/1997

* cited by examiner

Primary Examiner—Joseph Mancuso
Assistant Examiner—Anand Bhatnagar
(74) Attorney, Agent, or Firm—McDermott, Will & Emery

(57) ABSTRACT

Based on data for a designed, patterned figure, data for first through third contour figures as well as data for under-sized and over-sized figures are derived. Comparisons between the under-sized figure and the third contour figure and between the over-sized figure and the second contour figure are performed to check adequateness of resolution of the patterned figure. When the resolution is determined inadequate, information on a portion having such inadequate resolution is output. According to this method of verifying resolution of a patterned figure, a portion in a photo resist with inadequate resolution can easily be detected, thus permitting efficient device development.

15 Claims, 12 Drawing Sheets

T1,T3

T1, T2

PATTERNED FIGURE RESOLUTION VERIFICATION METHOD AND SEMICONDUCTOR PATTERN FORMING METHOD

BACKGROUND OF THE INVENTION

1. Field of the Invention

The present invention relates to a method of verifying resolution of a patterned figure, i.e., a photo resist pattern that is made by performing photolithography using a mask pattern in the step of photolithography, and a method of forming a semiconductor pattern. More particularly, the present invention relates to a method of verifying resolution of a patterned figure by detecting in advance a portion of the patterned figure with inadequate resolution to improve efficiency in device development, and a semiconductor pattern forming method for forming a pattern on a semiconductor substrate employing the above method of verifying resolution of the patterned figure.

2. Description of the Background Art

To accomplish still higher degree of integration in semiconductor integrated circuits, miniaturization of patterns has been proceeded. It thus is important, in a series of manufacturing steps of a semiconductor integrated circuit, to evaluate in advance a final shape of a photo resist pattern in the step of photolithography among others, to conduct such miniaturization of the pattern efficiently. An example of the evaluation method of a final shape of photo resist employing a conventional simulation technique will now be described with reference to attached drawings.

FIG. 19 is a flowchart of such simulation. Referring to FIG. 19, first in step SS1, data is set for a designed, patterned figure on a mask. Next, in step SS2, based on the data for the designed, patterned figure, optical image intensity distribution in an image plane (wafer surface) is obtained by optical image calculation. In step SS3, the obtained optical image intensity distribution is compared with the data for the designed, patterned figure to compute a contour line of light intensity having an equal intensity (hereinafter, referred to as a "contour") that best matches the designed, patterned figure. A figure according to the obtained contour has been used as an outline of a final pattern of photo resist.

In a practical wafer process, etching is conducted using as a mask a photo resist pattern formed on a substrate. When etching, however, the photo resist itself is subjected to etching, and thus, its film thickness gradually decreases, or, film thinning occurs. If the photo resist does not have a prescribed film thickness, a part of the photo resist pattern will be lost on the way of etching, and therefore, a desired pattern may not be formed on the substrate.

In addition, if there exists photo resist left between photo resist patterns, neighboring patterns that should naturally be separate may combine together, so that a prescribed photo resist pattern will not be formed on the substrate.

Therefore, in the step of photolithography, the photo resist pattern must be formed to have a prescribed film thickness in the region where the photo resist should be left, and the photo resist must be completely removed from the region in which it should not be left.

The above problems arise due to inadequate resolution of the photo resist in the step of photolithography. Accordingly, it is important to evaluate in advance a shape of photo resist pattern, so as to detect a portion with such inadequate resolution and to dispose a designed, patterned figure free from such deficiency in resolution.

The evaluation according to the conventional simulation as described above, however, only obtained a final shape (outline) of photo resist, and was unable to determine the resolution of the photo resist. It thus was necessary to evaluate the resolution of the photo resist by actually forming the photo resist pattern using, for example, an appropriate test pattern.

As a result, time-consuming pattern designing was required, and efficient semiconductor device development was hindered.

SUMMARY OF THE INVENTION

The present invention is made to solve the above-described problems.

An object of the present invention is to provide a method of verifying resolution of a patterned figure that allows a portion with inadequate resolution to be detected in a photo resist that corresponds to a designed, patterned figure. Another object of the present invention is to provide a method of forming a semiconductor pattern utilizing that method of verifying resolution of a patterned figure.

The method of verifying resolution of a patterned figure according to an aspect of the present invention includes the following steps. Data is set for a designed, patterned figure on a mask. Based on the data for the designed, patterned figure, optical image intensity distribution on a substrate is examined. The optical image intensity distribution and the data for the designed, patterned figure are compared to calculate data for a first contour figure having a first light intensity and best matching the designed, patterned figure. Data for an under-sized figure having the designed, patterned figure contracted by a prescribed amount and data for an over-sized figure having the designed, patterned figure expanded by a prescribed amount are calculated, which are to be used as indices when forming the designed, patterned figure as a photo resist pattern. Computed from the optical image intensity distribution are data for a second contour figure having a second light intensity that is equivalent to the light intensity with which substantially the entire photo resist film coated on the substrate is to be dissolved completely, and data for a third contour figure having a third light intensity that is equivalent to the light intensity with which substantially no photo resist film is to be dissolved. The data for the under-sized figure and the data for the third contour figure are compared to check whether the under-sized figure is included in the third contour figure, and the data for the over-sized figure and the data for the second contour figure are compared to check whether the second contour figure is included in the over-sized figure, thereby determining adequateness of the resolution of the designed, patterned figure. If the resolution of the designed, patterned figure is inadequate, information on a portion with such inadequate resolution is output.

According to this method, data for virtual under-sized and over-sized figures, and for the second and third contour figures are calculated, which are to be used as indices for determining whether a photo resist pattern can be obtained with adequate resolution corresponding to the designed, patterned figure. The second contour figure is a figure outside which substantially the entire photo resist is supposed to be completely dissolved. The third contour figure is a figure within which substantially no photo resist is considered to be dissolved. The under-sized figure is theoretically the smallest of the photo resist pattern that may be produced with adequate resolution corresponding to the designed, patterned figure, and the over-sized figure is the largest of the same. Therefore, if the under-sized figure is included in the third contour figure and the second contour figure is included in the over-sized figure, it can be determined that the resolution in the photo resist pattern corresponding to the designed, patterned figure is satisfactory. In contrast, if even one of those two conditions described above is not satisfied, the resolution of the photo resist pattern corresponding to the designed, patterned figure is determined as unsatisfactory, and information on a portion with such inadequate resolution is output. As explained above, the resolution of the designed, patterned figure can easily be determined, and if the resolution is inadequate, the designed, patterned figure can be modified based on the information on the portion with such inadequate resolution, and then the process for checking the resolution may be repeated again. A designed, patterned figure thus can be determined efficiently.

Preferably, the prescribed amount used in the step of calculating the data for under-sized figure is less than 50% of the minimum dimension of the designed, patterned figure.

This is because, if the prescribed amount is equal to or more than 50% of the minimum dimension, an under-sized figure corresponding to the designed, patterned figure cannot be acquired in a portion having that minimum dimension.

Preferably, the prescribed amount used in the step of calculating the data for over-sized figure is less than 50% of the minimum distance between neighboring patterns in the designed, patterned figure.

This is because, if the prescribed amount is equal to or more than 50% of the minimum distance, an over-sized figure corresponding to the designed, patterned figure cannot be obtained in a portion having that minimum distance.

When a positive photo resist is used, the light intensity of the first contour figure best matching the designed, patterned figure is set, in a relation between light intensity of exposed light and a dissolution rate of photo resist, equal to the light intensity at which the dissolution rate of the positive photo resist starts to increase as the light intensity increases. When a negative photo resist is used, the light intensity of the first contour figure is set equal to the light intensity with which the dissolution rate of the negative photo resist no longer decreases as the increase in light intensity.

Preferably, the second light intensity is set, in the relation between the light intensity of the exposed light and the dissolution rate of the photo resist, equal to the light intensity with which the dissolution rate of the photo resist is sufficiently high, and the dissolved amount that is a product of developing time and the dissolution rate is sufficiently large compared to the film thickness of the photo resist coated and formed on the substrate.

In this case, substantially the entire photo resist outside the second contour figure is supposed to be dissolved completely.

More preferably, the dissolved amount of photo resist is to be more than five times the film thickness of the photo resist coated and formed on the substrate.

In this case, the photo resist between neighboring patterns can be removed reliably.

Preferably, the third light intensity is set, in the relation between the light intensity of the exposed light and the dissolution rate of the photo resist, equal to the light intensity with which the dissolution rate of photo resist is sufficiently low and the dissolved amount that is a product of the developing time and the dissolution rate is sufficiently small with respect to the film thickness of the photo resist coated and formed on the substrate.

In this case, substantially no photo resist within the third contour figure is supposed to be dissolved.

More preferably, the dissolved amount of the photo resist is equal to or less than 20% of the film thickness of the photo resist coated and formed on the substrate.

In this case, when etching using the photo resist pattern as a mask, a sufficient amount of photo resist can be left even there occurs the film thinning of the photo resist.

The method of verifying resolution of a patterned figure according to another aspect of the present invention includes the following steps.

Data is set for a designed, patterned figure on a mask. Based on the data for the designed, patterned figure, optical image intensity distribution on a substrate is examined. The optical image intensity distribution and the data for the designed, patterned figure are compared to calculate data for the first contour figure having the first light intensity and best matching the designed, patterned figure. Further calculated are data for the second contour figure having the second light intensity that is equal to the light intensity with which substantially the entire photo resist coated on the substrate is to be dissolved completely, and data for the third contour figure having the third light intensity that is equal to the light intensity with which substantially no photo resist coated on the substrate is to be dissolved. The total number of component figures in the first contour figure, the total number of component figures in the second contour figure, and the total number of component figures in the third contour figure are respectively compared with the total number of component figures in the designed, patterned figure to check whether they match or not, to determine adequateness of the resolution of the designed, patterned figure. If the resolution of the designed, patterned figure is determined as inadequate, information on that is output.

According to this method, data for the first, second, and third contour figures are calculated. The first contour figure is a figure that has the first light intensity and best matches the designed, patterned figure. The second contour figure is a figure outside which substantially the entire photo resist is supposed to be dissolved completely. The third contour figure is a figure within which substantially no photo resist is considered to be dissolved. Therefore, if a portion in which photo resist should be left and a portion from which photo resist should be removed correspond to the designed, patterned figure, each of the total number of component figures within the first, second, and third contour figures must be consistent with the total number of component figures in the designed, patterned figure. If the total numbers of component figures within the first, second and third contour figures do not match the total number of component figures in the designed, patterned figure, respectively, it is considered that two component figures that are originally separate are counted as one component figure because, for example, neighboring patterns are combined together. The photo resist is thus determined as having deficiency in resolution. As a result, though information on a portion where the resolution is inadequate cannot be obtained, adequateness of the photo resist resolution can easily be determined, thereby allowing efficient device development.

The method of forming a semiconductor pattern according to yet another aspect of the present invention includes the following steps. Data is set for a designed, patterned figure on a mask. Based on the data for the designed, patterned figure, optical image intensity distribution on a substrate is examined. The optical image intensity distribution and the data for the designed, patterned figure are compared to calculate data for the first contour figure having the first light intensity and best matching the designed, patterned figure. Further calculated are data for the second contour figure having the second light intensity that is equivalent to the light intensity with which substantially the entire photo resist film coated on the substrate is dissolved completely, and data for the third contour figure having the third light intensity that is equivalent to the light intensity with which substantially no photo resist film is dissolved. Data for an under-sized figure having the designed, patterned figure contracted by a prescribed amount and data for an over-sized figure having the designed, patterned figure expanded by a prescribed amount are also calculated. The data for the under-sized figure and the data for the third contour figure are compared to check whether the under-sized figure is included within the third contour figure, and the data for the over-sized figure and the data for the second contour figure are compared to check whether the second contour figure is included within the over-sized figure, thereby determining adequateness of the resolution of the designed, patterned figure. A designed, patterned figure on a mask is determined based on the data on the adequateness of the resolution of the designed, patterned figure. A mask having the designed, patterned figure thus determined is then produced. Using this mask, photolithography and processing are conducted for patterning a film formed on a semiconductor substrate.

According to this method, the method of verifying the resolution of a patterned figure in one aspect of the present invention can be utilized when forming a semiconductor pattern. This results in efficient device development, and leads to reduction in development time and cost.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
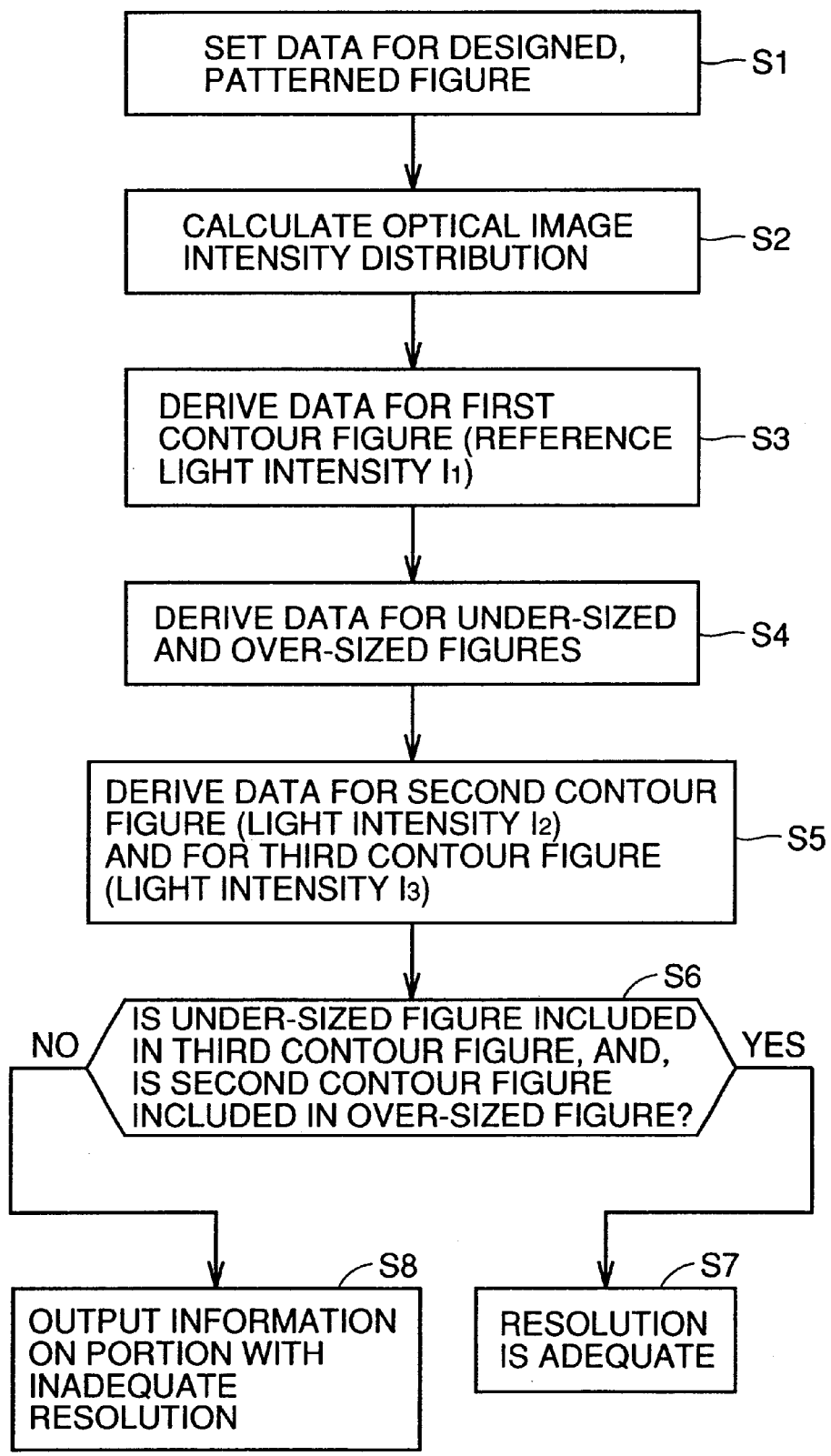
FIG. 1 shows an exemplary flowchart according to a first embodiment of the present invention.

The method of verifying resolution of a patterned figure according to the first embodiment of the present invention will now be described with reference to the drawings. FIG. 1 shows a flowchart of simulation as a verification method of resolution of a patterned figure. First, this flowchart will generally be described.

Referring to FIG. 1, in step S1, data for a designed, patterned figure on a mask is set. In the next step S2, optical image intensity distribution on a substrate (image plane) is obtained by optical image calculation, based on the data for the designed, patterned figure. Next, in step S3, the data for the designed, patterned figure and the optical image intensity distribution are compared to derive, from contour figures respectively consisting of equal light intensities in the optical image intensity distribution, a contour figure that best matches the designed, patterned figure. The contour figure thus derived is made to be the first contour figure, and the light intensity of the first contour figure is set as a reference light intensity $I_1$ being the first light intensity.

Next, in step S4, data for two virtual figures are derived, that are to be indices for determining whether a photo resist pattern can be obtained with adequate resolution corresponding to the designed, patterned figure. Geometrically, these two figures, i.e., an under-sized figure and an oversized figure, can be considered to be figures used for determining whether the photo resist pattern has the same topology as the designed, patterned figure. Specifically, data for the under-sized figure having the designed, patterned figure contracted by a prescribed amount and data for the oversized figure having the designed, patterned figure expanded by a prescribed amount are derived. Here, as will be described later, the amount to be contracted or expanded is limited by the minimum dimension or the distance between patterned figures in the designed, patterned figure.

Next, in step S5, data for a contour figure having a light intensity $I_2$, that is different from the reference light intensity $I_1$ and is equivalent to the light intensity with which substantially the entire photo resist film coated on the substrate is to be dissolved completely, are derived from the optical image intensity distribution. This contour figure is made to be the second contour figure. Further derived from the optical image intensity distribution are data for a contour figure having a light intensity $I_3$, that is different from reference light intensity $I_1$ or light intensity $I_2$, and is equivalent to the light intensity with which substantially no photo resist film coated on the substrate is to be dissolved. This contour figure is made to be the third contour figure.

Here, as will be described later, when using a positive photo resist, light intensity $I_2$ is higher than reference light intensity $I_1$, and light intensity $I_3$ is lower than reference light intensity $I_1$. In contrast, when using a negative photo resist, light intensity $I_2$ is lower than reference light intensity $I_1$, and light intensity $I_3$ is higher than reference light intensity $I_1$.

Next, in step S6, inclusion relations between figures are determined based on the obtained data for respective figures. Specifically, the data for the under-sized figure and the data for the third contour figure are compared to determine whether the under-sized figure is included in the third contour figure (condition A). Further, the data for the over-sized figure and the data for the second contour figure are compared to determine whether the second contour figure is included in the over-sized FIG. (condition B). Only when the conditions A and B are both satisfied, i.e., when the under-sized figure is included in the third contour figure and the second contour figure is included in the over-sized figure, the designed, patterned figure is determined to be achieved with an adequate resolution by photolithography, as shown in step S7.

If either one or both of those conditions A and B is not satisfied, the designed, patterned figure is determined to have a portion with unsatisfactory resolution. In this case, as shown in step S8, information on the portion having such inadequate resolution is output. The process then returns to step S1 with such information, and the designed, patterned figure is modified, and evaluated again with this simulation. Efficient device development can thus be realized.

Figure 3:
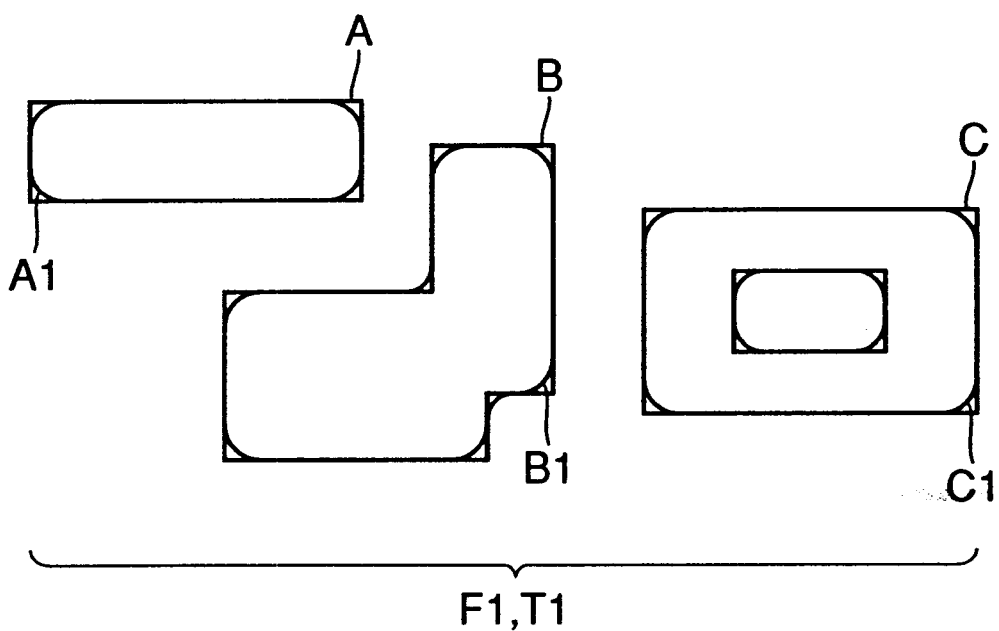
FIG. 3 shows the designed, patterned figure and a first contour figure according to the first embodiment.

Now, the above-described flowchart will be described further in detail. First in step Si, data for a designed, patterned figure $F_1$, including patterned figures A, B and C, are set as the designed, patterned figure on the mask. Next in step S2, optical image intensity distribution on a substrate is calculated based on the data for designed, patterned figure $F_1$. In step S3, as shown in FIG. 3, data for the first contour figures A1, A2 and A3 that best match respective patterned figures A, B and C of designed, patterned figure F1 are derived from the contour figures consisting of equal light intensities, respectively. The light intensity of the first contour figure T1 is set to be the reference light intensity $I_1$.

Figure 8:
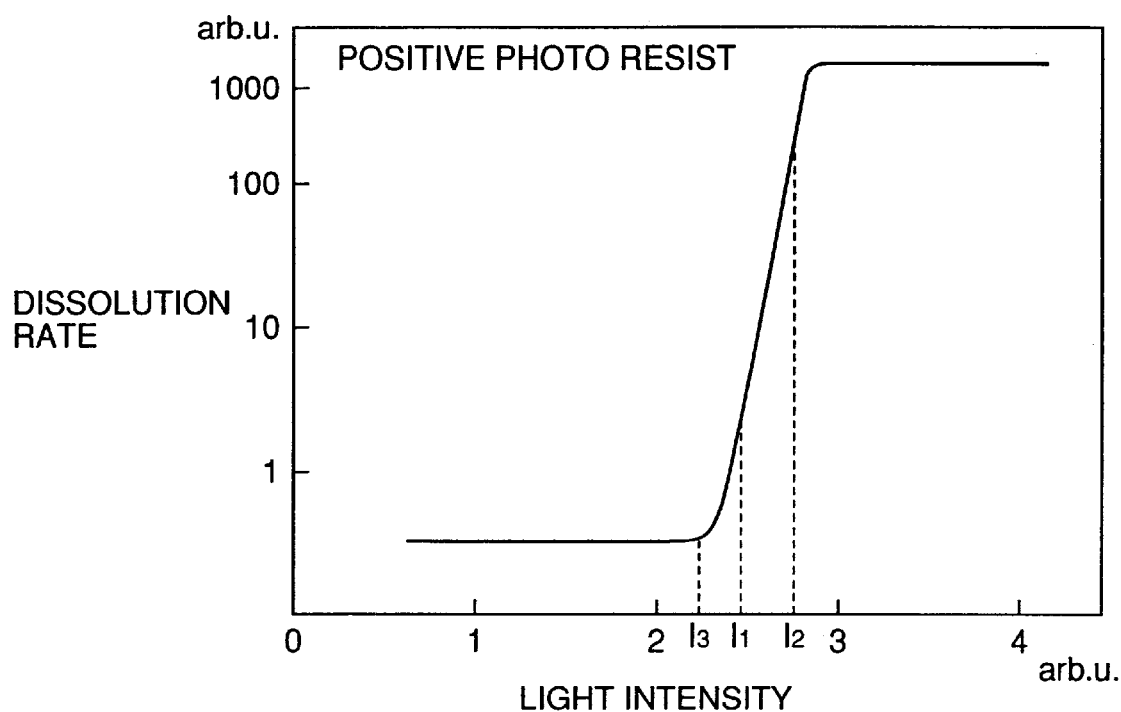
FIG. 8 shows dependence of a dissolution rate of a positive photo resist on light intensity according to the first embodiment.

When a positive photo resist is used, as shown in FIG. 8 illustrating a relation between the light intensity of exposed light and the dissolution rate of the positive photo resist, the reference light intensity is set to correspond to light intensity $I_1$ at which the dissolution rate of the positive photo resist starts to increase as the light intensity increases. Note that the term "light intensity" in this specification refers to a value of light intensity itself of the exposed light multiplied by time of exposure (i.e., light intensity×exposed time).

Figure 4:
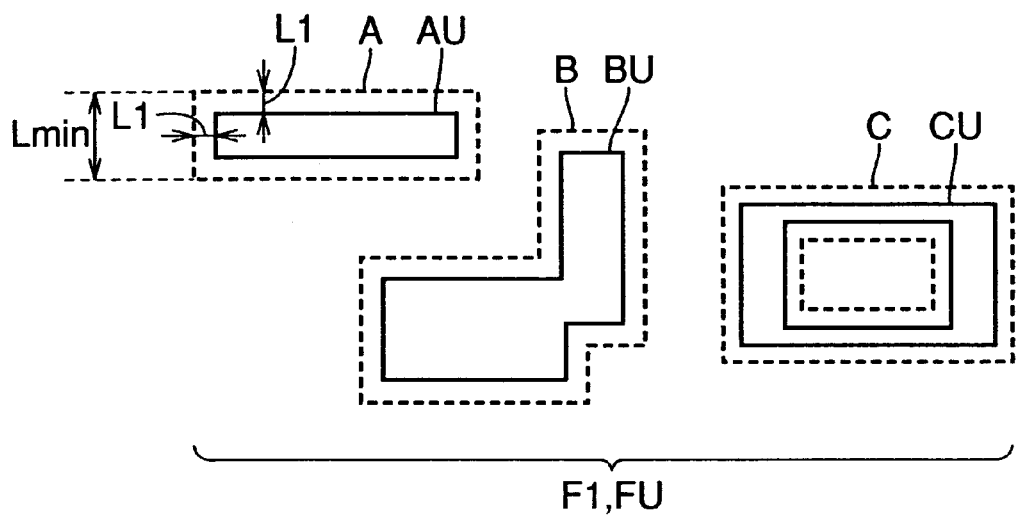
FIG. 4 shows the designed, patterned figure and an under-sized figure according to the first embodiment.

Next in step S4, as shown in FIG. 4, data for under-sized figures AU, BU and CU are derived by receding the outlines of respective patterned figures A, B and C (dotted lines) inwards by a length L1, without moving their central positions. Those under-sized figures are used to guarantee that the photo resist pattern has the same topology as the designed, patterned figure. When the minimum dimension of the designed, patterned figure is expressed as $L_{min}$, length L1 is required to be less than 50% of the value $L_{min}$. This is because the under-sized figure cannot be derived if L1 is equal to or more than 50% of the minimum dimension $L_{min}$, in which case the photo resist pattern will no longer have geometrically the same topology as the designed, patterned figure.

Figure 5:
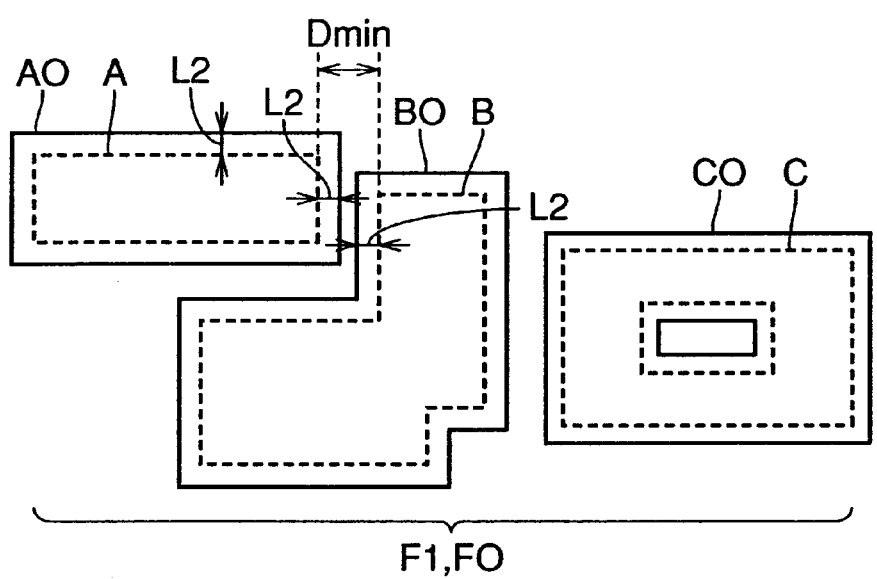
FIG. 5 shows the designed, patterned figure and an over-sized figure according to the first embodiment.

Also in the step S4, as shown in FIG. 5, data for over-sized figures AO, BO and CO are derived by moving the outlines of respective patterned figures A, B and C (dotted lines) outwards by a length L2, without changing their central positions. The over-sized figures are again used to guarantee that the photo resist pattern has the same topology as the designed, patterned figure. When the minimum distance between neighboring patterned figures is expressed as $D_{min}$, length L2 is required to be less than 50% of the value $D_{min}$. This is because, if length L2 is equal to or more than 50% of the minimum distance $D_{min}$, two neighboring patterned figures that should be separate are derived as a combined, single figure, and thus the photo resist pattern will no longer have geometrically the same topology as the designed, patterned figure.

In the next step S5, data for the second contour figure T2 having light intensity $I_2$ and data for the third contour figure T3 having the third light intensity $I_3$ are derived from the optical image intensity distribution. When a positive photo resist is used, the second light intensity $I_2$ is set equal to the light intensity with which substantially the entire photo resist film coated on the substrate is to be completely dissolved, as shown in FIG. 8. More specifically, the second light intensity $I_2$ is set equal to the light intensity with which the dissolved amount of photo resist is to be at least five times the film thickness of the photo resist coated and formed on the substrate. Setting such value assures that the photo resist is dissolved and removed reliably.

The value of the second light intensity $I_2$ has been experimentally estimated as 1.7 time the first light intensity $I_1$, for example. The third light intensity $I_3$ is set, as shown in FIG. 8, to the light intensity with which substantially no photo resist film coated on the substrate is to be dissolved. More specifically, the third light intensity $I_3$ is set to the light intensity with which the dissolved amount of photo resist is to be at most 20% of the film thickness of the photo resist coated and formed on the substrate. Setting such value ensures a sufficient amount of photo resist to be left even when the film thinning of the photo resist occurs.

The value of the third light intensity $I_3$ has been experimentally estimated to be 0.7 times the first light intensity $I_1$, for example.

From the above description, the second contour figure can be considered to be a figure outside which the photo resist is supposed to be completely dissolved in the step of photolithography. The third contour figure can be considered to be a figure within which substantially no photo resist is to be dissolved.

Figure 6:
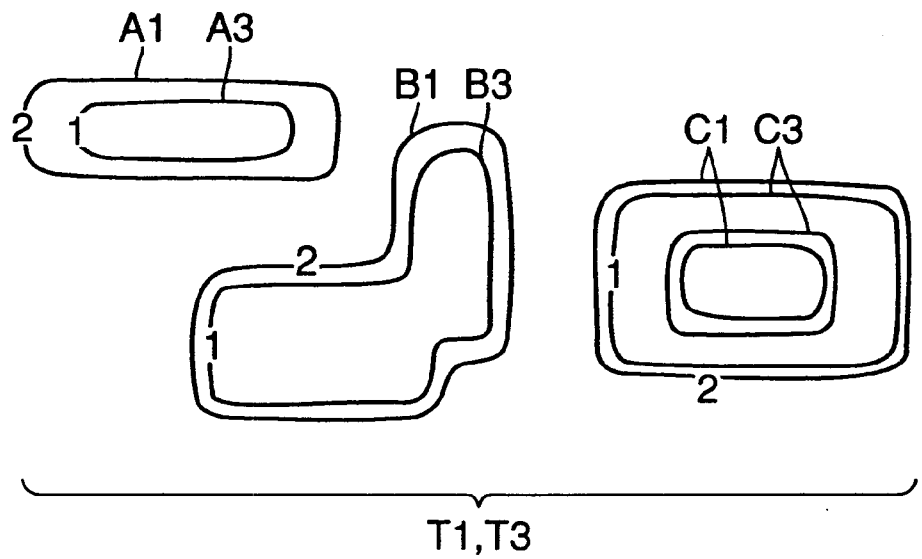
FIG. 6 shows the first and third contour figures according to the first embodiment.
Figure 7:
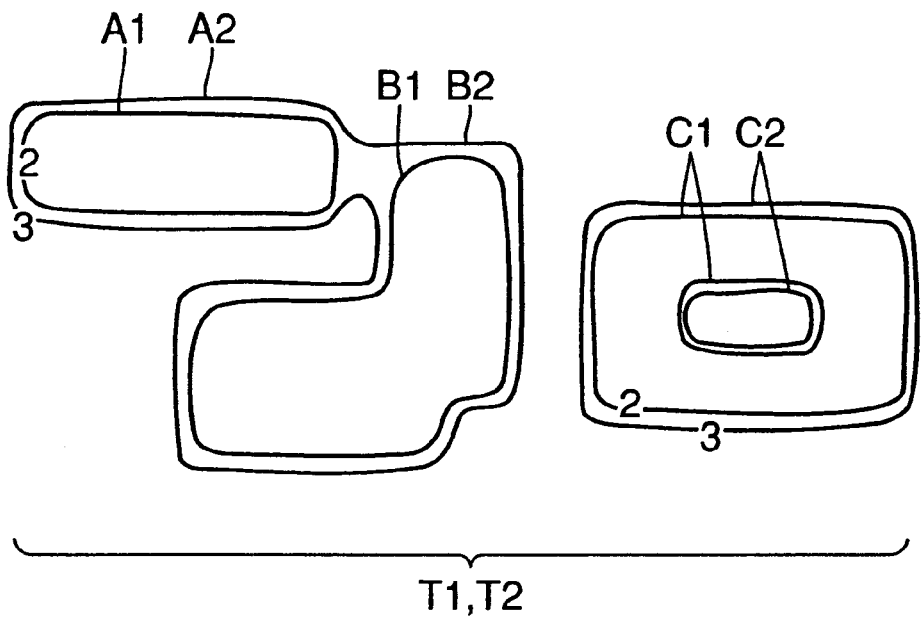
FIG. 7 shows the first and second contour figures according to the first embodiment.

FIG. 6 shows an example of the third contour figure T3 thus derived, which includes the third contour figures A3, B3 and C3, and the first contour figure T1. FIG. 7 shows an example of the second contour figure T2 including the second contour figures A2, B2 and C2, along with the first contour figure T1. Note that the values shown in respective contour figures T3, T2 represent relative light intensities.

Figure 9:
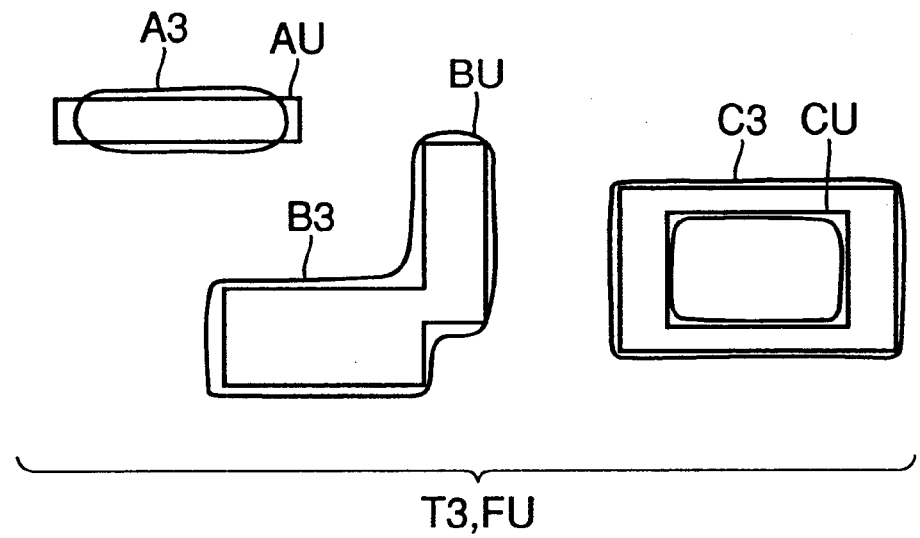
FIG. 9 shows the under-sized figure and the third contour figure according to the first embodiment.

In the next step S6, the data for the under-sized figure FU and the data for the third contour figure T3 are compared for judgement. Specifically, if under-sized figure FU is not included in third contour figure T3, positive photo resist in a portion where the photo resist should be left will be dissolved, hindering formation of a desired patterned figure on the substrate. The resolution is thus determined as unsatisfactory. FIG. 9 shows an example of such case with inadequate resolution. Referring to FIG. 9, of the under-sized figure FU, under-sized figures BU and CU are included in respective third contour figures B3 and C3. However, under-sized figure AU is not included in the third contour figure A3.

Figure 11:
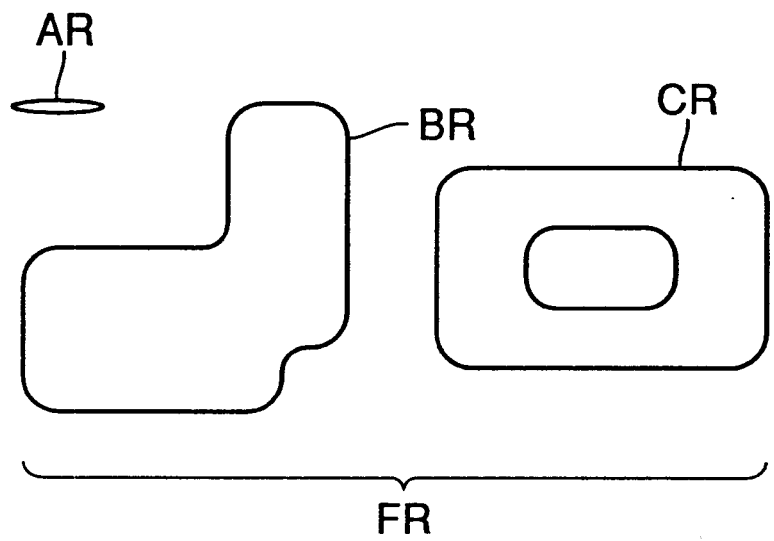
FIG. 11 shows an exemplary photo resist pattern according to the first embodiment.

As a result, as shown in FIG. 11, though photo resist patterns BR and CR are formed on the substrate corresponding to the designed, patterned figures B and C, respectively, pattern AR corresponding to the designed, patterned figure A is not formed in a good shape on the substrate as the photo resist pattern.

Figure 10:
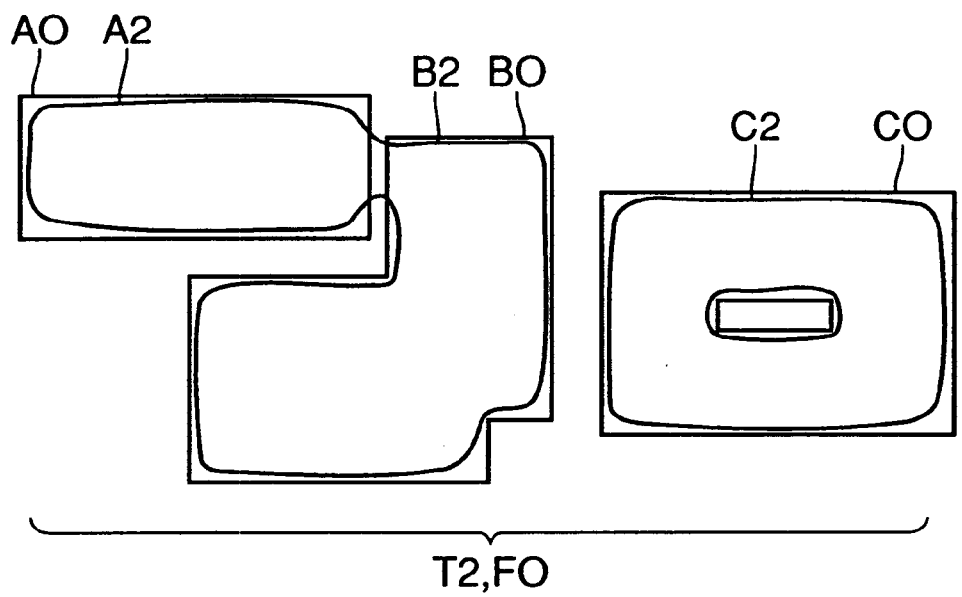
FIG. 10 shows the over-sized figure and the second contour figure according to the first embodiment.
Figure 12:
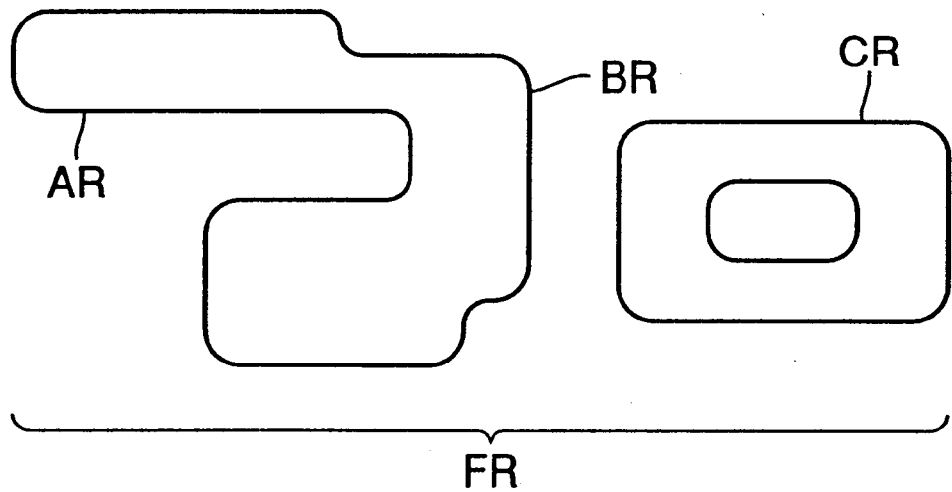
FIG. 12 shows another example of photo resist pattern according to the first embodiment.

Further in step S6, the data for the over-sized figure FO and the data for the second contour figure T2 are compared for judgement. That is, if the second contour figure is not included in the over-sized figure, the positive photo resist in a portion where it should be removed is not dissolved or removed sufficiently. A desired patterned figure cannot thus be formed on the substrate, and therefore, the resolution is determined as inadequate. FIG. 10 is an example of such case with unsatisfactory resolution. Referring to FIG. 10, of second contour figure T2, second contour figure C2 is included in the over-sized figure CO. However, second contour figures A2 and B2 are not included in respective over-sized figures AO and BO in a portion where they are close to each other. As a result, as shown in FIG. 12, though photo resist pattern CR corresponding to the designed, patterned figure C is formed on the substrate successfully, photo resist patterns AR and BR corresponding to the designed, patterned figures A and B may be combined together and formed as a single photo resist pattern on the substrate.

If a desired patterned figure cannot be formed on the substrate in step S6 as described above, in the next step S8, information on a portion of the photo resist pattern having such unsatisfactory resolution is output.

Only in the case where under-sized figure FU is included in third contour figure T3 and second contour figure T2 is included in over-sized figure FO in step S6, information that the photo resist pattern is adequate in resolution is output in the next step S7.

According to the above-described method, of a positive photo resist based on a designed, patterned figure, a portion having unsatisfactory resolution can be detected in advance, and that portion can be modified and then evaluated again, to determine a designed, patterned figure on a mask. This eliminates the necessity in actually making a photo mask to evaluate resolution of the photo resist pattern, so that device development can be done more efficiently.

Second Embodiment

The first embodiment was described employing, by way of example, a positive photo resist as a photo resist. The present embodiment will be described as the case where a negative photo resist is applied as a photo resist, with reference to the flowchart shown in FIG. 1.

Figure 13:
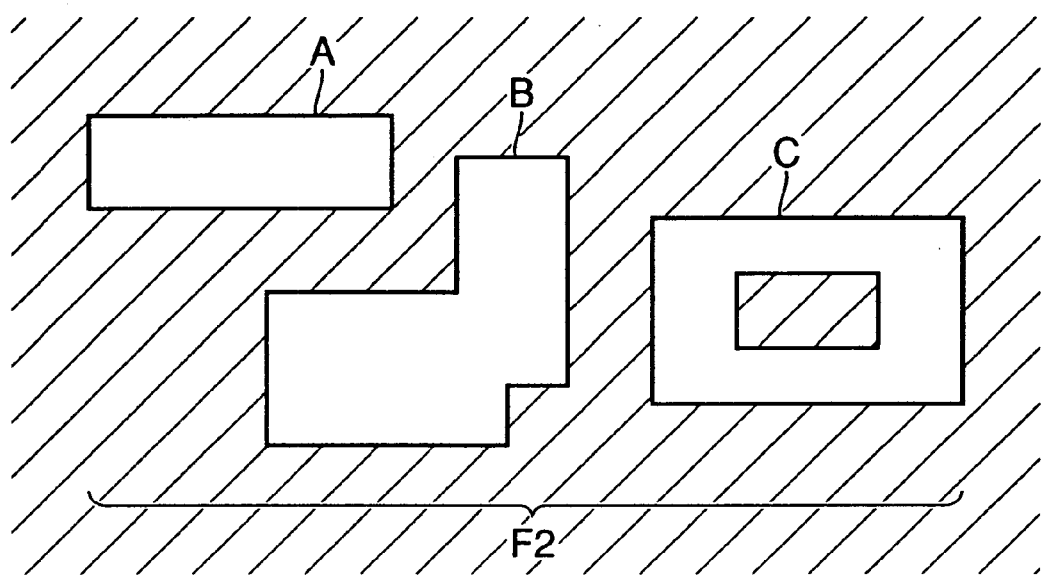
FIG. 13 shows an example of designed, patterned figure according to a second embodiment of the present invention.

First, in step S1, data for a designed, patterned figure F2 shown in FIG. 13 as the designed, patterned figure is set. As is shown by crosshatching, a region transmitting exposed light and a region shielding the light in this designed, patterned figure F2 are the reverse of those in the designed, patterned figure F1. In the next step S2, optical image intensity distribution on the substrate is calculated based on the data for the designed, patterned figure F2.

In step S3, as in FIG. 3, data for the first contour figure that best matches patterned figures A, B and C of designed, patterned figure F2 are derived from contour figures consisting of equal light intensities, respectively. The light intensity of the first contour figure is set as a reference light intensity $I_1$ being the first light intensity.

Figure 16:
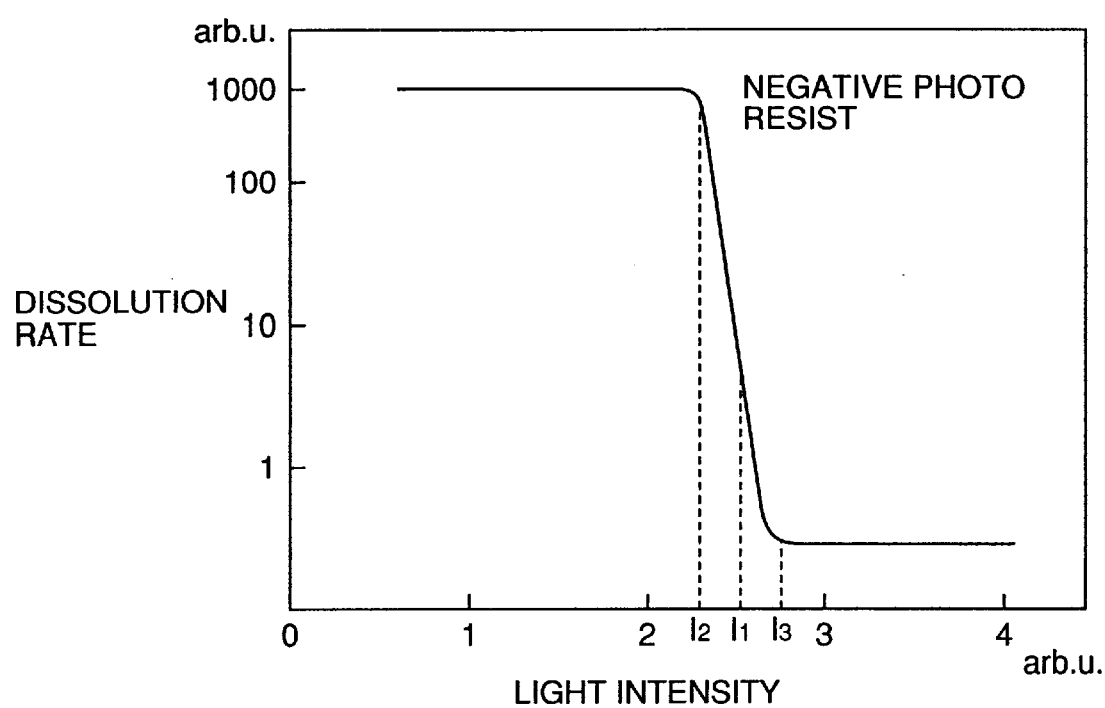
FIG. 16 shows dependence of a dissolution rate of a negative photo resist on light intensity according to the second embodiment.

When using a negative photo resist, the first light intensity is set to correspond to the light intensity $I_1$ at which, in the relation between the light intensity of exposed light and the dissolution rate of the negative photo resist as shown in FIG. 16, the dissolution rate of the negative photo resist no longer decreases as the increase of the light intensity.

Next, in step S4, as in FIG. 4, data for under-sized and over-sized figures corresponding to respective patterned figures are derived.

Figure 14:
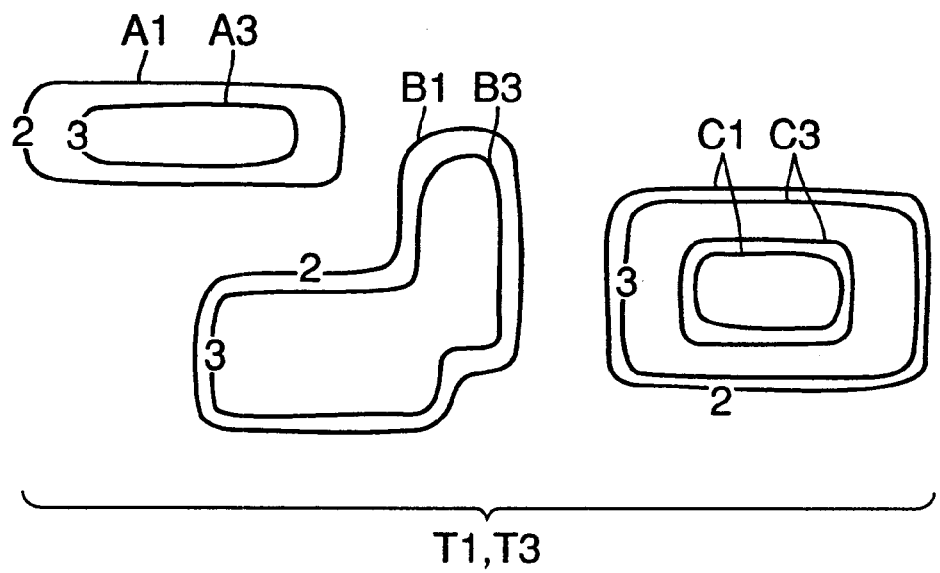
FIG. 14 shows the first and third contour figures according to the second embodiment.
Figure 15:
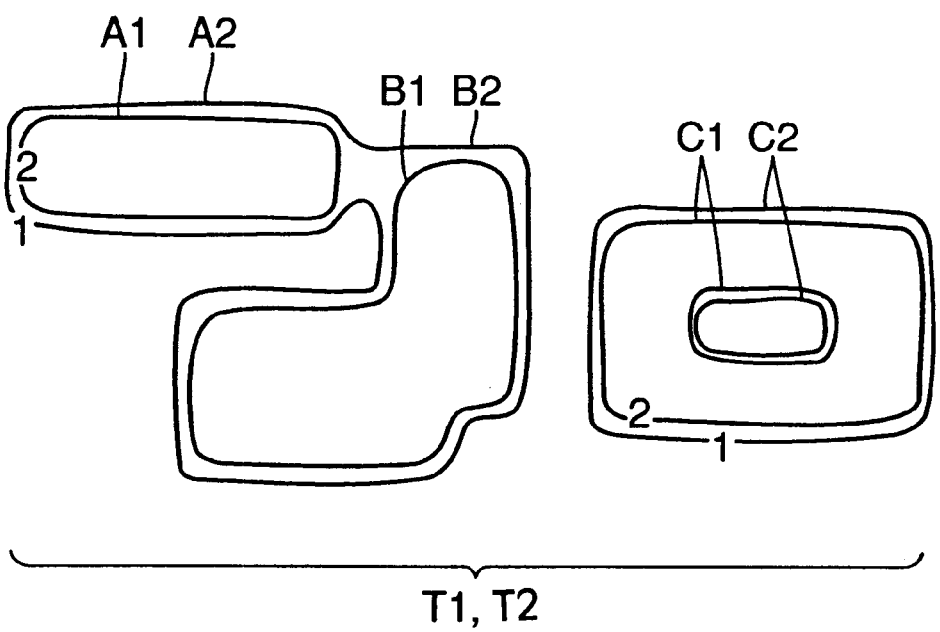
FIG. 15 shows the first and second contour figures according to the second embodiment.

In step S5, data for the second contour figure having a light intensity $I_2$ and data for the third contour figure having a light intensity $I_3$ are derived. FIG. 14 shows an example of the derived third contour figure T3 along with the first contour figure T1. FIG. 15 shows an example of the derived second contour figure T2 and the first contour figure T1. When using the negative photo resist, light intensity $I_2$ with which substantially the entire photo resist film coated on the substrate is to be completely dissolved is lower than reference light intensity $I_1$. Light intensity $I_3$ with which substantially no negative photo resist film is to be dissolved is higher than first light intensity $I_1$. That is, the relation of the light intensities when using the negative photo resist is the reverse of that when the positive photo resist is used, as the numeric values corresponding to the respective contour figures show.

Next in step S6, as in FIGS. 9 and 10, the data for the under-sized figure and the data for the third contour figure are compared, and the data for the over-sized figure and the data for the second contour figure are compared. According to the comparison, if the under-sized figure is not included in the third contour figure, the negative photo resist will be dissolved in a portion where the resist should be left, and thus a desired patterned figure of photo resist cannot be formed on the substrate. The resolution is thus determined as unsatisfactory.

If the second contour figure is not included in the over-sized figure, the negative photo resist will not be sufficiently dissolved in a portion where the resist should be removed completely, thus hindering formation of a desired patterned figure on the substrate. The resolution is therefore determined as inadequate. In those cases with the unsatisfactory resolution, as in the first embodiment, information on the portion with such inadequate resolution is output in the next step S8. When the resolution is determined to be adequate, that information is output in step S7.

As described above, when using the negative photo resist, as in the case where the positive photo resist is used, a portion of the patterned figure of photo resist having unsatisfactory resolution can be detected in advance, modified, and evaluated again, to determine a designed, patterned figure. Accordingly, device development can be conducted efficiently.

Third Embodiment

In the simulations as described in the first and second embodiments, information on a portion of the photo resist pattern having inadequate resolution has been output when such defect exists. In the present embodiment, an easier method by which only the adequateness of resolution of photo resist is determined will be described by way of example, with reference to the drawings.

Figure 17:
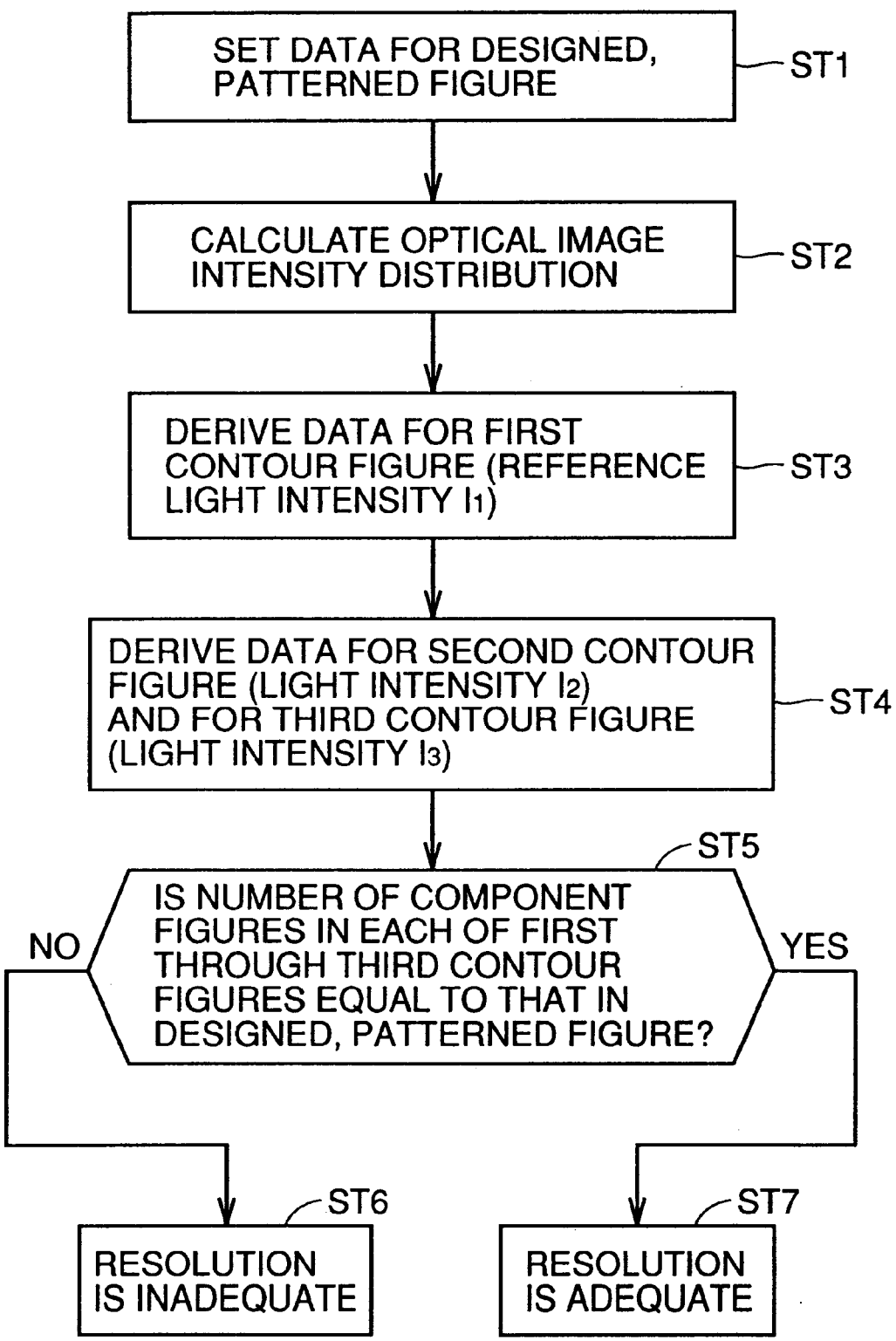
FIG. 17 shows a flowchart according to a third embodiment of the present invention.

FIG. 17 is a flowchart of this method. Referring to FIG. 17, steps ST1 through ST4 are identical to steps S1, S2, S3 and S5 in FIG. 1 described in the first embodiment, and thus description thereof is not repeated.

Figure 2:
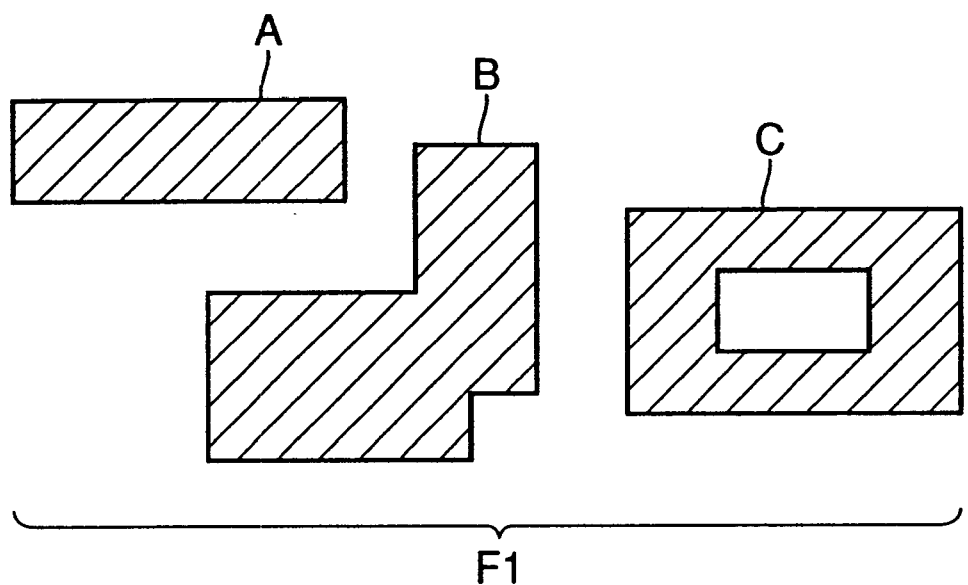
FIG. 2 shows an example of designed, patterned figure according to the first embodiment.

In the next step ST5, the number of component figures in the second contour figure obtained from the data for the second contour figure is compared with the number of component figures in the designed, patterned figure. Similarly, the number of component figures in the third contour figure from the data for the third contour figure and the number of component figures in the designed, patterned figure are compared. This will now be described in detail with the case where the designed, patterned figure shown in FIG. 2 is to be employed. Note that a positive photo resist is used as a photo resist in this embodiment.

Figure 18:
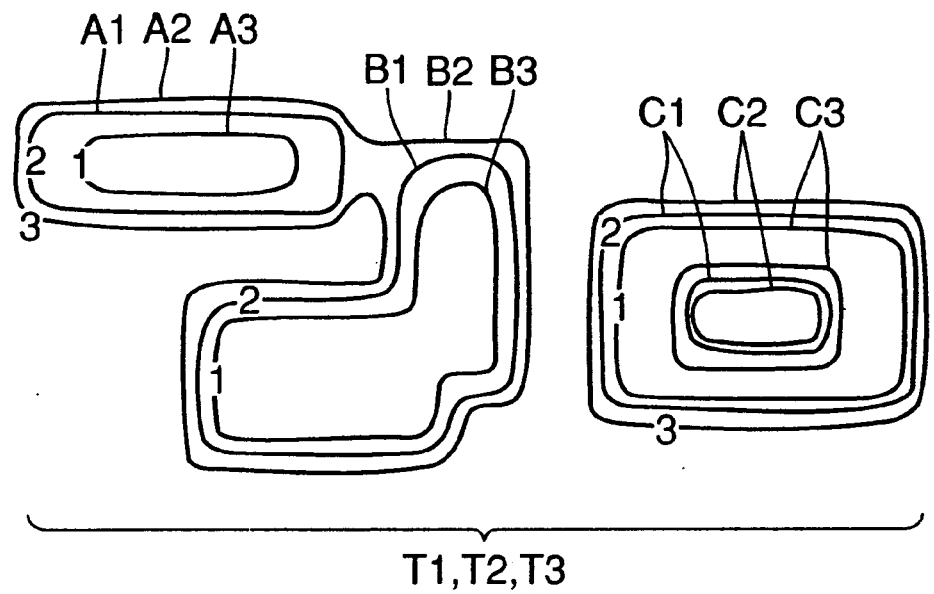
FIG. 18 shows the first to third contour figures according to the third embodiment.
Figure 19:
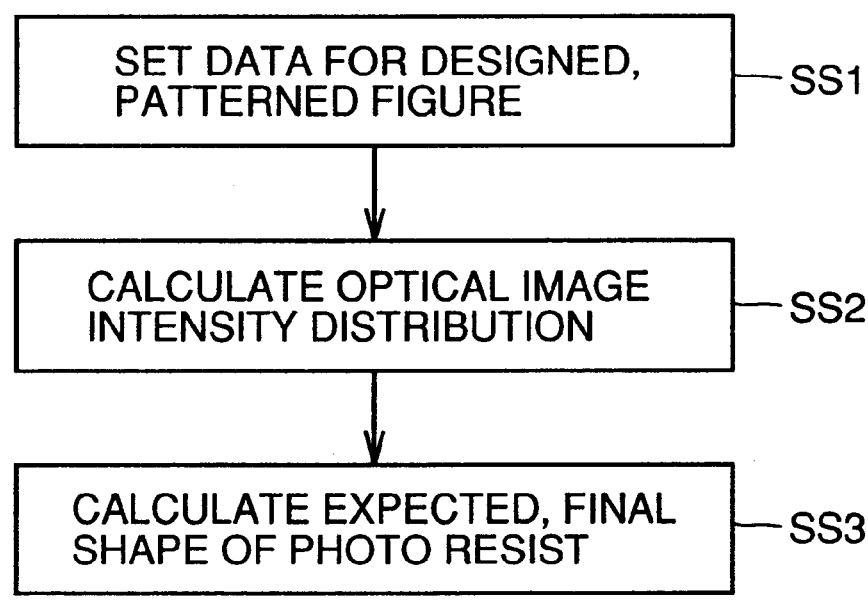
FIG. 19 shows a conventional flowchart for acquiring an expected final figure of photo resist.

In the positive photo resist, the first to third contour figures T1, T2 and T3 are derived as shown in FIG. 18, as described in the first embodiment.

With reference to FIG. 18, the first contour figure T1 consists of the first contour figures A1, B1 and C1, and the number of component figures is 3. The third contour figure T3 consists of the third contour figures A3, B3 and C3, and the number of component figures is also 3. In the second contour figure T2 consisting of the second contour figures A2, B2 and C2, however, second contour figures A2 and B2 are combined together, and thus the number of component figures in the second contour figure T2 is 2. The designed, patterned figure F1 is composed of the designed, patterned figures A, B and C, and thus the number of component figures is 3, as shown in FIG. 2.

Therefore, the numbers of component figures of the first and third contour figures T1 and T3 are respectively consistent with the number of component figures in the designed, patterned figure F1, while the number of component figures in the second contour figure T2 is not consistent with that in the designed, patterned figure F1. In this case, as shown in FIG. 12 described in the first embodiment, a positive photo resist pattern is formed with photo resist patterns AR and BR being connected to each other. Following the above processing, information only that the resolution is inadequate is output in step ST6.

In step ST5, if the numbers of component figures in the first to third contour figures are all consistent with the number of component figures in the designed, patterned figure, respectively, the resolution of the photo resist pattern is determined as satisfactory, and information that the resolution is adequate is output in the next step ST7.

As explained above, according to this technique, the number of component figures in each contour figure is compared to the number of component figures in the designed, patterned figure. Though information on a portion having inadequate resolution cannot be obtained as in the first and second embodiments, adequateness of the resolution of photo resist can easily be determined. Accordingly, this simulation also facilitates efficient device development.

Fourth Embodiment

In this embodiment, a method of forming a semiconductor pattern on a substrate utilizing the technique described in the first or second embodiment will be described by way of example. First, processing is conducted in accordance with the flowchart shown in FIG. 1. If information on a portion having unsatisfactory resolution is obtained, the data for the designed, patterned figure on a mask is modified based on the information. Repeating such process, a designed, patterned figure on a mask is determined. A mask having the designed, patterned figure thus determined is then produced. Using this mask, a photo resist formed on a film, e.g., a conductive layer, on a semiconductor substrate is subjected to photolithography, to form a prescribed photo resist pattern. Using this photo resist pattern as a mask, the film such as a conductive layer is then subjected to etching, thereby forming a desired pattern of, e.g., an interconnection line.

Accordingly, a prescribed pattern can be formed on the semiconductor substrate. The method of forming the semiconductor pattern according to the present embodiment is useful particularly in a region where a random pattern is formed, rather than a region in which a relatively regular pattern is formed. In the region having such random pattern, a portion having unsatisfactory resolution can be detected in advance and then modified, and thus, a final form of designed, patterned figure on a mask can easily be determined. As a result, a semiconductor device in which relatively a large number of random patterns are to be formed, e.g., the semiconductor device including a logic circuit, can be developed efficiently, and development time as well as product cost can also be reduced.

Although the present invention has been described and illustrated in detail, it is clearly understood that the same is by way of illustration and example only and is not to be taken by way of limitation. The spirit and scope of the present invention are limited only by the terms of the appended claims.

What is claimed is:

1. A method of verifying resolution of a patterned figure, comprising the steps of:

setting data for a designed, patterned figure on a mask;

examining optical image intensity distribution on a substrate based on said data for the designed, patterned figure;

comparing said optical image intensity distribution with said data for the designed, patterned figure to obtain data for a first contour figure having a first light intensity and best matching said designed, patterned figure;

computing data for an under-sized figure having said designed, patterned figure contracted by a prescribed amount and data for an over-sized figure having said designed, patterned figure expanded by a prescribed amount, for use as indices in forming said designed, patterned figure as a photo resist pattern;

computing, from said optical image intensity distribution, data for a second contour figure having a second light intensity that is equivalent to a light intensity with which substantially an entire photo resist film coated on the substrate is to be dissolved completely, and data for a third contour figure having a third light intensity that is equivalent to a light intensity with which substantially no photo resist is dissolved;

comparing said data for under-sized figure with said data for the third contour figure to determine whether said under-sized figure is included in said third contour figure, and comparing data for said over-sized figure with data for said second contour figure to determine whether said second contour figure is included in said over-sized figure, thereby determining adequateness of resolution of said designed, patterned figure; and, if the resolution of said designed, patterned figure is inadequate, outputting information on a portion where the resolution is unsatisfactory.

2. The method of verifying the resolution of the patterned figure according to claim 1, wherein said prescribed amount in said step of computing the data for said under-sized figure is less than 50% of a minimum dimension in said designed, patterned figure.

3. The method of verifying the resolution of the patterned figure according to claim 1, wherein said prescribed amount in said step of computing the data for said over-sized figure is less than 50% of a minimum distance between neighboring patterns.

4. The method of verifying the resolution of the patterned figure according to claim 1, wherein, when a positive photo resist is used, said first light intensity is set equal to a light intensity at which, in a relation between a light intensity of exposed light and a dissolution rate of photo resist, the dissolution rate of the positive photo resist starts to increase as an increase in the light intensity, and, when a negative photo resist is used, said first light intensity is set equal to a light intensity at which the dissolution rate of the negative photo resist no longer decreases as the increase in the light intensity.

5. The method of verifying the resolution of the patterned figure according to claim 1, wherein said second light intensity is capable of causing photo resist dissolution during a predetermined period of development time in an amount that is sufficiently large compared to a film thickness of photo resist coated and formed on the substrate.

6. The method of verifying the resolution of the patterned figure according to claim 5, wherein said second light intensity is capable of causing photo resist dissolution that is more than five times the film thickness of the photo resist coated and formed on the substrate.

7. The method of verifying the resolution of the patterned figure according to claim 1, wherein said third light intensity is set equal to a light intensity with which, in the relation between the light intensity of exposed light and the dissolution rate of photo resist, the dissolution rate of the photo resist is sufficiently low and the dissolved amount that is a product of developing time and dissolution rate is sufficiently small compared to a film thickness of photo resist coated and formed on the substrate.

8. The method of verifying the resolution of the patterned figure according to claim 7, wherein said dissolved amount of the photo resist is at most 20% of the film thickness of the photo resist coated and formed on the substrate.

9. A method of verifying resolution of a patterned figure, comprising the steps of:

setting data for a designed, patterned figure on a mask;

examining optical image intensity distribution on a substrate based on the data for said designed, patterned figure;

comparing said optical image intensity distribution and the data for said designed, patterned figure to compute a first contour figure having a first light intensity and best matching said designed, patterned figure;

computing data for a second contour figure having a second light intensity equivalent to a light intensity with which substantially an entire photo resist coated on the substrate is dissolved completely, and data for a third contour figure having a third light intensity equivalent to a light intensity with which substantially no photo resist coated on the substrate is dissolved;

examining whether a total number of component figures in said first contour figure, a total number of component figures in said second contour figure, and a total number of component figures in said third contour figure are respectively consistent with a total number of component figures in said designed, patterned figure, to determine adequateness of the resolution of said designed, patterned figure; and if the resolution of said designed, patterned figure is inadequate, outputting information that the resolution is unsatisfactory.

10. The method of verifying the resolution of the patterned figure according to claim 9, wherein, when a positive photo resist is used, said first light intensity is set equal to a light intensity at which, in a relation between a light intensity of exposed light and a dissolution rate of photo resist, the dissolution rate of the positive photo resist starts to increase as an increase in the light intensity, and, when a negative photo resist is used, said first light intensity is set equal to a light intensity at which the dissolution rate of the negative photo resist no longer decreases as the increase in the light intensity.

11. The method of verifying the resolution of the patterned figure according to claim 9, wherein said second light intensity is capable of causing photo resist dissolution during a predetermined period of development time in an amount that is sufficiently large compared to a film thickness of photo resist coated and formed on the substrate.

12. The method of verifying the resolution of the patterned figure according to claim 11, wherein said second light intensity is capable of causing photo resist dissolution that is more than five times the film thickness of the photo resist coated and formed on the substrate.

13. The method of verifying the resolution of the patterned figure according to claim 9, wherein said third light intensity is set equal to a light intensity with which, in the relation between the light intensity of exposed light and the dissolution rate of photo resist, the dissolution rate of the photo resist is sufficiently low and the dissolved amount that is a product of developing time and dissolution rate is sufficiently small compared to a film thickness of photo resist coated and formed on the substrate.

14. The method of verifying the resolution of the patterned figure according to claim 13, wherein said dissolved amount of the photo resist is at most 20% of the film thickness of the photo resist coated and formed on the substrate.

15. A method of forming a semiconductor pattern, comprising the steps of:

setting data for a designed, patterned figure on a mask;

examining optical image intensity distribution on a substrate based on the data for said designed, patterned figure;

comparing said optical image intensity distribution and the data for said designed, patterned figure, to compute data for a first contour figure having a first light intensity and best matching said designed, patterned figure;

computing data for a second contour figure having a second light intensity equivalent to a light intensity with which substantially the entire photo resist film coated on the substrate is to be dissolved completely, and data for a third contour figure having a third light intensity equivalent to a light intensity with which substantially no photo resist film is to be dissolved;

computing data for an under-sized figure having said designed, patterned figure contracted by a prescribed amount, and data for an over-sized figure having said designed, patterned figure expanded by a prescribed amount;

comparing the data for said under-sized figure and the data for said third contour figure to check whether said under-sized figure is included in said third contour figure, and comparing the data for said over-sized figure and the data for said second contour figure to check whether said second contour figure is included in said over-sized figure, to determine adequateness of the resolution of said designed, patterned figure;

determining a designed, patterned figure on a mask according to the data of the adequateness of the resolution of said designed, patterned figure;

producing a mask having the designed, patterned figure thus determined; and conducting photolithography and processing using said mask, to pattern a film formed on a semiconductor substrate.

* * * * *